United States Patent [19]

Butters et al.

[11] 4,328,461
[45] May 4, 1982

[54] APPARATUS FOR AND METHOD OF MEASURING A HIGH VOLTAGE ELECTRIC FIELD

[75] Inventors: William G. Butters, Florissant; Joseph E. Lee, St. Ann, both of Mo.

[73] Assignee: McDonnell Douglas Corporation, St. Louis, Mo.

[21] Appl. No.: 54,005

[22] Filed: Jul. 2, 1979

[51] Int. Cl.³ ............................................. G01N 31/02
[52] U.S. Cl. ....................................................... 324/72
[58] Field of Search ........................... 324/72, 72.5, 96

[56] References Cited

U.S. PATENT DOCUMENTS

| | | | |
|---|---|---|---|
| 3,586,973 | 6/1971 | Lawton | 324/72 |
| 3,732,425 | 5/1973 | Ellert | 324/96 |
| 3,916,305 | 10/1975 | Few, Jr. | 324/72 |
| 3,917,996 | 11/1975 | Wagner | 324/72 |
| 3,919,636 | 11/1975 | Few | 324/72 |
| 4,070,572 | 1/1978 | Summerhayes | 324/96 |
| 4,091,327 | 5/1978 | Larsen et al. | 324/96 |
| 4,100,487 | 7/1978 | Fletcher et al. | 324/96 |

*Primary Examiner*—Michael J. Tokar
*Attorney, Agent, or Firm*—Lionel L. Lucchesi

[57] ABSTRACT

Apparatus for measuring a high voltage electric field, such as may be used in simulating lightning strikes or the like on a test specimen, is disclosed. In general, a capacitive electric field sensor is disclosed which utilizes a pair of spaced conductors or electrodes and which is placed in the field to be measured. The conductors shield a device within the sensor which generates a signal responsive to the intensity of the electric field. This signal is transmitted to a remote data acquisition system by means of non-electrically conductive data transmission lines (e.g., fiber optic transmission lines) so as to electrically isolate the sensor and the data acquisition system whereby the sensor only minimally distorts or affects the field being measured thereby. A method for measuring high voltage electric fields is also disclosed.

12 Claims, 11 Drawing Figures

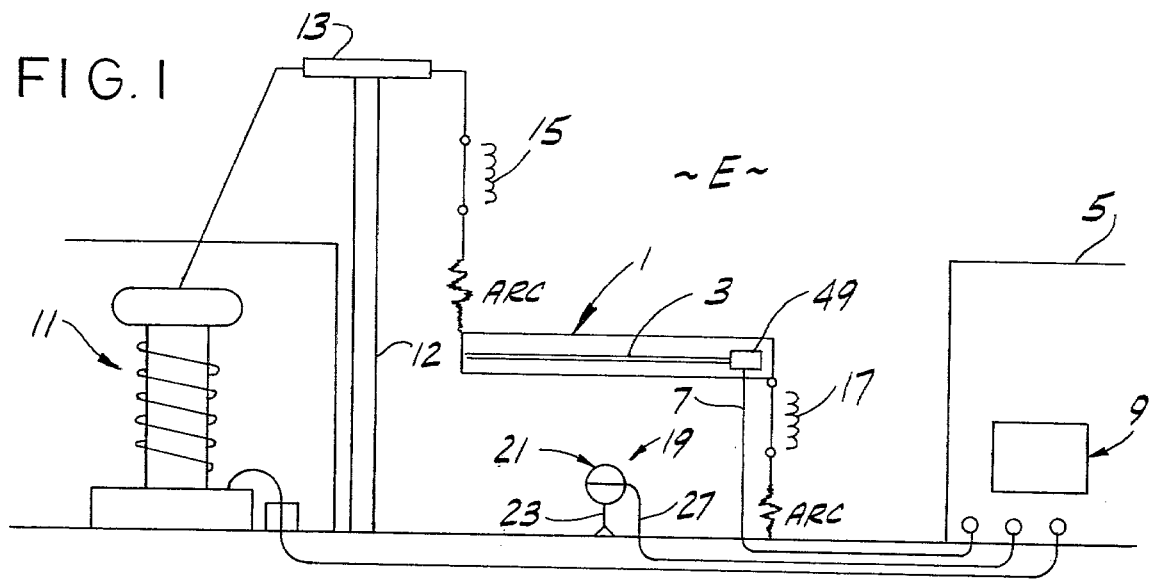
FIG.1
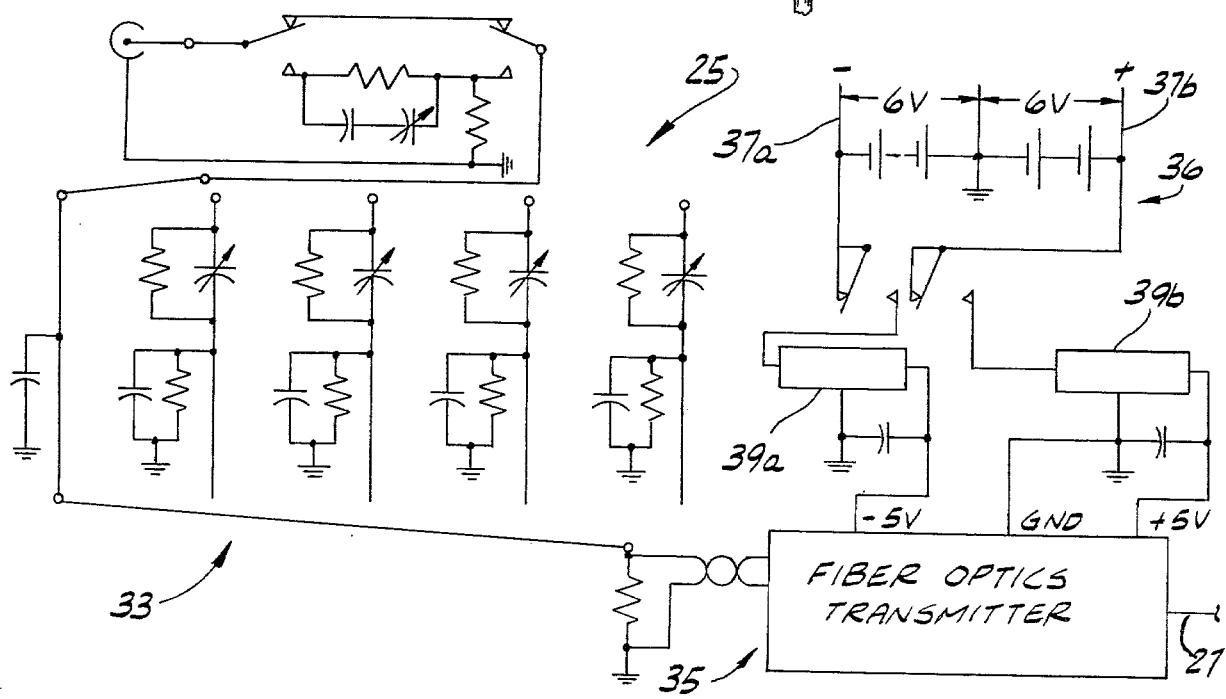
FIG.2
FIG.3

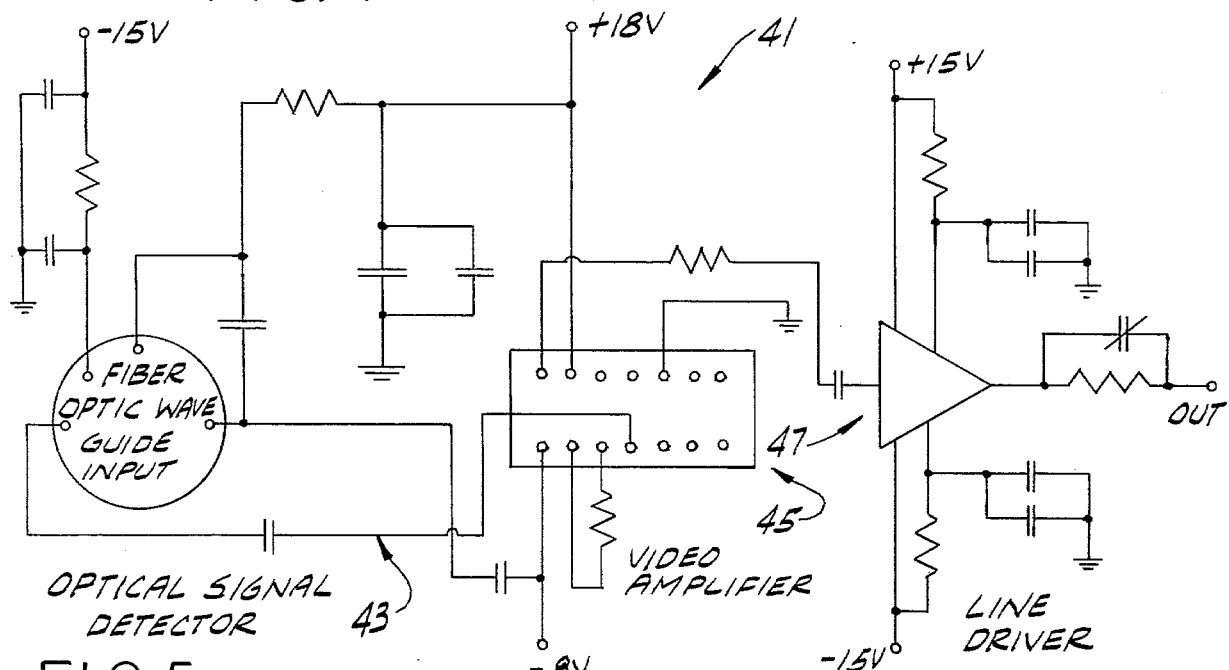
FIG. 4
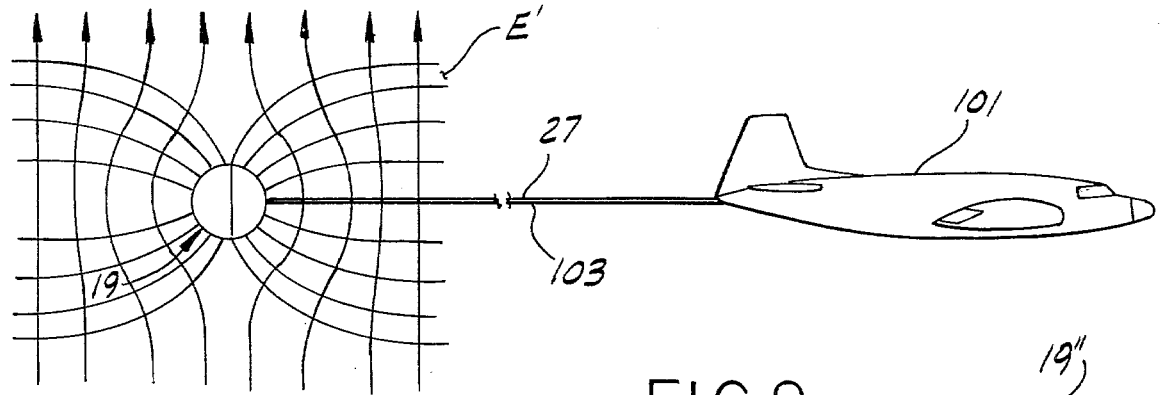
FIG. 5
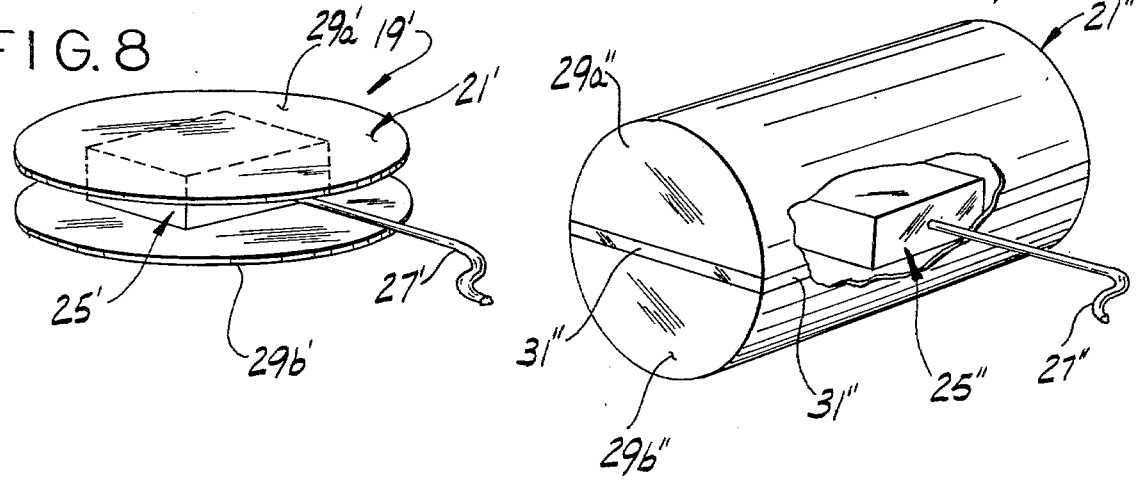
FIG. 8
FIG. 9

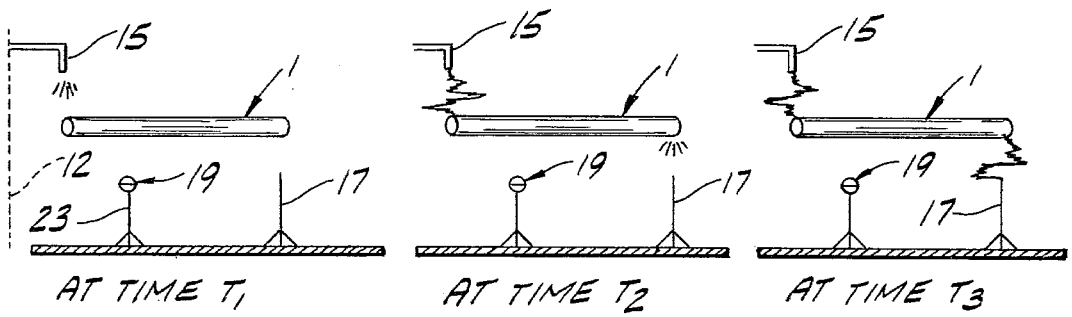
HIGH VOLTAGE ARC SEQUENCE FOR DOUBLE ARC CASE
FIG. 7
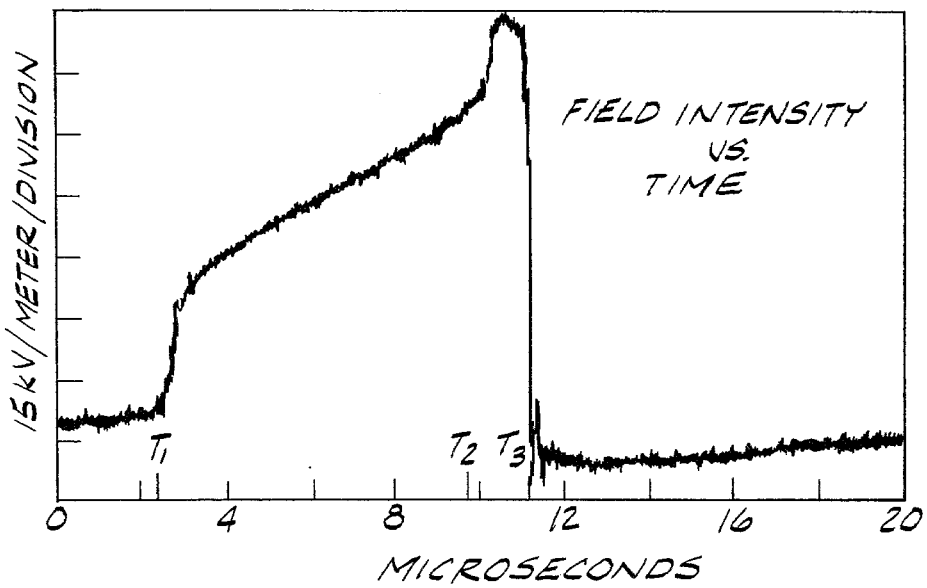

APPARATUS FOR AND METHOD OF MEASURING A HIGH VOLTAGE ELECTRIC FIELD

BACKGROUND OF THE INVENTION

This invention relates to a system for and a method of sensing or measuring an electric field with a minimum distortion or perturbation of the electric field being measured. This invention is particularly well-suited for measurement of high voltage electric field such as may be encountered in lightning simulation tests or the like.

Modern aircraft and aerospace vehicles oftentimes must operate in high voltage electric field environments, such as when flying through thunderstorms or the like. The exact effects of high voltage electric field environments and in particular the effects of actual lightning strikes on aircraft are not well known. It is, however, generally known that lightning strikes on aircraft have caused problems in various onboard digital systems, such as digital navigation systems, onboard computers, and other flight safety related equipment. In certain advanced vehicles, conventional servo-hydraulic flight control systems are being replaced by digital flight control systems (referred to as fly-by-wire flight control systems) in which electrical (digital) control signals are transmitted from a pilot controlled input to processors located adjacent the various control surfaces on the aircraft. These processors then control a hydraulic actuator in response to the digital input commands. Usually, an onboard computer is used in a fly-by-wire system to generate these control signals and no conventional servo-hydraulic system is provided as a back-up. The effects of induced voltages and/or currents in fly-by-wire flight control systems are not well-known and thus there is a need to be able to test these systems in high voltage electric field environments and when the aircraft is struck by lightning. It is a concern that induced voltages and current in these fly-by-wire systems may cause various problems (e.g., instability or the like) in the fly-by-wire control system.

In general, high voltage electric field tests have been conducted by generating a high voltage field by means of a high voltage generator, such as a staged capacitor Marx generator or the like, by exposing a test specimen to the field, and by measuring the voltages or currents induced in a pair of conductors inside the test specimen. By increasing the voltage of the electric field, arcs simulating lightning strikes may be caused to jump from a high voltage electrode to the test specimen. Addtionally, discharges through the aircraft to the ground (ground return strokes) are simulated by an arc from the test specimen to a ground electrode, These high voltage generators are capable of generating electric field potentials from a few thousand volts to several thousand or even a few million volts.

In other types of lightning simulation tests, a low level pulsed current test is performed which is sometimes referred to as a lightning transient analyzer test. This technique employs the use of low level current pulses which are transmitted through the aircraft structure (i.e., the test specimen) so as to produce transient signals on internal wiring. The transients on selected circuits are measured and interpreted (i.e., extrapolated upwardly) in terms of the parameters of the driving current wave form. This technique has been useful for rapidly screening various aircraft circuits. However, this technique requires the assumption that all coupling is magnetic and it further require extrapolation of the data over a extremely wide range.

A long standing and important problem has been persistently present in conducting high voltage electric field tests, namely, how to reliably and accurately measure the strength of the electric field. It is a typical requirement of most high voltage electric field tests to determine not only the induced currents within the test specimen, but also to determine the strength of the electric field to which the test specimen is exposed and to have a relatively high level of confidence in these electric field strength measurements. According to the basic principles of electrostatics, however, any conductive body, whether charged or uncharged, modifies an electric field by its mere presence in the field because of the effect broadly known as electrostatic induction. Generally, when any conductive body is exposed to an electrostatic field, it becomes polarized (i.e., the positive and negative charges within the body tend to move within the body). This polarization causes the overall electric field to be altered from what it would have been if the body had not been present in the electric field.

Not only does a sensor placed in the electric field distort the field, but the sensor must, of course, be coupled to a read-out device, such as an oscilloscope, a recorder, or a data acquisition system, so that the output of the sensor may be observed and recorded. However, if the read-out device is placed in the electric field, its mass will also effect the field to an even greater degree than the sensor alone. If the read-out device is located remotely from the sensor, the lead wires connecting the sensor and the read-out device will, in some instances, form a ground loop and thus alter the field.

Likewise, another similar problem with recording test data from the test specimen is known. More specifically, ground loops between the test specimen and the remotely located data acquisition systems have resulted in perturbations of the electric field surrounding the test specimen and thus have adversely affected the results of the tests.

Accordingly, test personnel could not be certain whether the field strength measurements being recorded realistically represented the field to which the test specimen was actually exposed. Moreover, prior sensors tended to distort the field to such a degree that many changes in field strength could not even be measured. As a result of this inability to measure many changes in the electric field, the actual response of test specimens in rapidly changing high voltage fields could not heretofore reliably be determined.

While field measurement techniques are also quite important in such test areas as radio frequency interference (RFI) and nuclear electromagnet pulsation (EMP) test techniques, these other areas of electric field measurement do not involve the high voltage fields used in lightning simulation testing. Thus, the special problems encountered and solved in the RFI and EMP test environments have generally not been applicable to high voltage electric field testing.

Additionally, accurate data of the electric field characteristics of actual thunderstorms and cloud formations is not well-known. One of the problems in making accurate assessments of actual electric field data in thunderstorms and cloud formations is that the airplane entering the area to be measured distorts the electric field therein. Thus, there is a need to know the actual electric field environment of a thunderstorm or other atmospheric phenomenon so that the electrostatic field of thunderstorms and lightning strikes can be more accurately simulated.

SUMMARY OF THE INVENTION

Among the several objects and features of this invention may be noted the provision of an electric field sensor which results in minimum distortion of the electric field being measured and which enables accurate and reliable measurement of the field strength in both rapidly changing or steady state electric field environments;

The provision of such a sensor in which the sensor is electrically isolated from the read-out or recording device connected thereto so as to eliminate ground loops between the sensor and the read-out device;

The provision of such a sensor which may be readily, accurately, and reliably calibrated;

The provision of such a sensor which enables certain high voltage phenomenon which were heretofore unmeasurable to be accurately and reliably measured;

The provision of a method of determining the electric field characteristics of an actual thunderstorm and other atmospheric electrostatic characteristics to be measured substantially free of distortion as may be caused by the presence of an airplane monitoring the electric field;

The provision of a method of conducting high voltage electric field simulations in which the ground loops between the electric field sensor and the data acquisition and the ground loops between the test specimen and the data acquisition system are effectively eliminated; and The provision of such a sensor which is of simple and rugged construction, which is reliable in operation, and which is of low cost to manufacture and to use.

Other objects and features of this invention will be in part apparent and in part pointed out hereinafter.

This invention, generally stated, relates to apparatus for measuring an electric field comprising a pair of conductors (or electrodes) adapted to be placed in the electric field to be measured. These conductors are electrically separate from one another. Means is provided which is connected to the conductors for sensing the electric potential of the field and for generating an output signal indicative of the electric field being measured. Means is provided for receiving this signal with the receiving means being located remove from the sensor so as to have substantially no effect on the electric field adjacent the sensor. Non-electrically conductive means is provided for transmitting the signal from the sensing means to the remote receiving means.

The method of this invention of simulating a high voltage electric field on a test specimen and for determining the voltages induced in this test specimen comprises supporting the test specimen so that it is in position to be exposed to an electric field and so that it is electrically isolated from ground planes and other structures. Then a high voltage electric field is generated proximate the test specimen. A sensor is placed within the electric field for measuring the strength of the electric field to which the test specimen is exposed. Data from both the electric field sensor and from the test specimen is transmitted to a remote data acquisition system (which may comprise recorders, oscilloscopes, or other apparatus for monitoring and/or recording the test data) via non-electrically conductive data transmission lines thereby to eliminate the possibility of forming a ground loop between the test specimen and the sensor and their respective data acquisition systems which could distort the electrical field being measured.

Still further, this invention relates to a method of measuring an electric field in the atmosphere such as may be present in a thunderstorm or the like. This method comprises the steps of flying an aircraft through the electric field to be measured. An electric field sensor is towed behind the aircraft by means of non-electrically conductive tow line at a distance sufficient to substantially prevent disturbances or perturbations of the electrical field proximate the sensor such as may be caused by the presence of the aircraft in the electrical field. Then, the electrical field is sensed, and data from the sensor is transmitted to a remote data acquisition system, such as may be located in the aircraft, by means of non-electrically conductive data transmission means.

BRIEF DESCRIPTION OF THE DRAWINGS

FIG. 1 is a diagrammatic view of a typical high voltage electric field simulation test setup in which a high voltage generator generates a high intensity electric field adjacent a test specimen, in which an electric field sensor of the present invention proximate the test specimen measures the field to which the test specimen is exposed, in which voltages are induced within the test specimen, and in which data representing the electric field to which the test specimen is exposed and data representing the induced voltages and/or currents in the test specimen is transmitted to a remote data acquisition system by mean of non-electrically conductive (i.e., fiber optic) data transmission lines;

FIG. 2 is a perspective view of a first embodiment of the electric field sensor of the present invention;

FIG. 3 is an electrical schematic of means located within the electric field sensor for sensing the electric field to which the sensor is exposed and for transmitting an optical signal responsive to the electrical field from the sensor to the remotely located data acquisition system;

FIG. 4 is an electrical schematic of means located remotely from the sensor for receiving the optical signal from the sensor and for transforming this signal into a signal compatible with the data acquisition system;

FIG. 5 is a diagrammatic view of the method of the present invention for determining the characteristics of the electric field of a thunderstorm or the like in such manner that the electric field is not appreciably disturbed;

FIGS. 6a–6c is a series of diagrammatic illustrations showing the sequence of a double arc high voltage test;

FIG. 7 is a plot of the intensity of the electric field measured by a sensor of the present invention placed in proximity to the test specimen shown in FIGS. 6a–6c;

FIG. 8 is a perspective view of another embodiment of the sensor of the present invention; and FIG. 9 is a perspective view of still another embodiment of the sensor of the present invention.

Corresponding reference characters indicate corresponding parts throughout the several views of the drawings.

DESCRIPTION OF PREFERRED EMBODIMENTS

Referring now to the drawings, a typical high voltage electric field test setup is diagrammatically illustrated in FIG. 1. As generally indicated at reference character 1, a test specimen (e.g., an elongate sheet metal cylinder or the like) is mounted within a space in which a high voltage electric field E is to be generated. As shown, test specimen 1 is supported clear of the wall, floors and ceiling of the test area (i.e., clear of the ground planes of the test area) by suitable dielectric supports in such manner that the test specimen will be completely surrounded by the electric field. When the electric field is impressed on the test specimen, voltages and/or currents are induced within a pair of conductors or wires 3 within the test specimen. In accordance with this invention, voltages and/or currents induced in conductors 3 within the test specimen are transmitted to a remote screen room 5 by means of non-electrically conductive data transmission lines 7. Located within screen room 5 is a suitable data acquisition system 9 for recording, monitoring, and/or displaying various test parameters including the voltages induced in the test specimen. For example, data acquisition systems 9 may including one or more transient digital recorders, such as a Model 8100 recorder from Biomation Corporation of Curpertino, Calif., and several oscilloscopes. In addition, the system may include a suitable mini-computer, such as a Hewlett-Packard 9825 programmable calculator, for data reduction and for transformation of the data into the frequency domain. In addition, a plotter driven by the computer may be provided. It will be understood that data acquisition system 9, such as above-described, is conventional and does not per se constitute an integral part of the present invention. Virtually any data acquisition system may be utilized within the broader aspects of the present invention.

The test set-up further includes a high voltage generator 11, such as a staged capacitive Marx generator, for generating electric field E within the test area. The generator is isolated from the test specimen by a grounded shield 12 so as to prevent the field of the generator from acting on the test specimen. The output of the generator is directed to an output resistor 13. An input inductor or electrode 15 is positioned relative to test specimen 1, but yet is not touching the test specimen. Upon energization of the high voltage generator, an electric field is generated and the field surrounds and acts upon the test specimen. The characteristics of the electric field (i.e., the potential or voltage of the field and the rate of change of the field) may be selectively controlled according to desired test conditions and may be preprogrammed in a manner such as is well known to those skilled in the high voltage testing art.

If the potential of the electric field is sufficiently high, streamers or electric sparks will be present at the end of inductor 15. Upon the field becoming of sufficiently high voltage, the streamers will attach to test specimen 1 thus simulating a lightning strike on the test specimen. An output inductor or resistor 17 on the test specimen serves to form the generator waveshape and a ground return path to the generator.

Generally, it is desirable not only to monitor and to record voltages induced in test specimen 1, but also the monitor and record the strength (i.e., the electrostatic potential) of electric field E as a function of time during the test. An electric field sensor of this invention, as indicated in its entirety at 19, is provided adjacent test specimen 1 for sensing the electric field.

As shown in FIG. 1, electric field sensor 19 includes a generally spherical sensor body 21 supported on a dielectric support 23 adjacent test specimen 1 clear of the floor of the test area so as to constitute a free floating sensor (i.e., a sensor free of the effects of the test area) which is free to collect a charge. A field sensor and signal generator, as generally indicated at 25, is mounted within and is shielded by sensor body 21. This signal generator means senses the characteristics of the electrical field and transmits a signal (data) responsive to the electric field characteristics to data acquisition system 9 located remotely from the sensor (for example, located remotely in screen room 5). In accordance with this invention, electric field data is transmitted to the remote data acquisition system by an electrically insulative (i.e., non-electrically conductive) data transmission line 27 so as to electrically isolate sensor 21 from the data acquisition system thereby to prevent the formation of ground loops between sensor 19 and the data acquisition system. In turn, this greatly reduces perturbations or disturbances on the electric field being monitored. As herein shown, this electrically insulative data transmission line 27 is preferably a suitable optical fiber transmission line which is made of non-electrically conductive material, such as glass fibers or suitable synthetic resin material. The fiber optic transmission line is conventional and may, for example, be purchased from Meret, Inc. of Santa Monica, Calif., under the trade designation GALITE.

Sensor body 21 is comprised of a pair of part-spherical (or hemispherical) conductors or electrodes 29a, 29b of electrically conductive material (e.g., sheet copper or the like). The part-spherical conductors or electrodes are mechanically fastened (e.g., bolted) together so as to form a generally spherical sensor body 21, but are electrically insulated or separated from one another by means of electrical insulation material 31 (see FIG. 2) which is disposed between the inner face of the conductors thereby to electrically isolate the conductors from one another so as to form a capacitive electric field sensor. For example, a suitable electrical insulation, pressure sensitive tape may be applied to the interface between the hemispherical conductors so as to electrically isolate them from one another. The two sensors or electrodes 29a, 29b act as a current source similar to a dipole antenna with the current or voltage generated therein being proportional to the electric field to which the sensor is exposed. Because of the capacitive characteristics of the sensor, the output signal of the sensor is also responsive to the frequently of the electrical field. Sensor and signal generator 25 disposed within sensor body 21 picks up the voltage signal generated by electrodes 29a, 29b. Of course, voltage sensor and signal generator is housed in a suitable housing 32 (see FIG. 2). As shown in FIG. 3, sensor and signal generator 25 includes a voltage attenuator circuit, as generally at 33, for attenuation of the voltage signal sensed by conductors 29a, 29b, and a fiber optic transmitter 35 for converting the voltage signal into an infra-red analog optical signal and for transmitting this optical signal to remote data acquisition system 9. This fiber optic transmitter may, for example, be a model 2008 commercially available from Meret, Inc. of Santa Monica. Calif. Power is supplied to fiber optic transmitter 35 by a self-contained power supply 36 carried within housing 30. More particularly, this power supply is shown to be a pair of six volt rechargeable batteries, as indicated at 37a, 37b, connected with a voltage divider circuit. The output of these rechargeable batteries is stepped down to 5 volts by means of voltage regulators 39a, 39b so as to prevent changes in gain of the fiber optic transmitter upon a decay in the output voltage of the batteries as may occur during sustained use of the batteries. In actual use, these batteries have sufficient reserve power to provide power to sensor and signal generator 25 for two hours or more of continuous operation.

In accordance with this invention, fiber optic transmitter 35 is preferably shielded from the electric field within sensor body 21 and is connected to remote data acquisition system 9 by means of non-electrically conductive fiber optic transmission lines 27. The analog optical signals transmitted by fiber optic transmission lines 27 are responsive to the characteristics of the electric field being measured. These optical signals are fed into a receiver 41 (as shown in detail in FIG. 4) which may, for example, be located within screen room 5 for converting the transmitted optical signals into electrical signals compatible with data acquisition system 9.

As shown in FIG. 4, receiver 41 comprises an optical signal detector 43 which receives the analog optical signals from transmitter 35 via fiber optic lines 27, these optical signals being responsive to the electric field being measured by sensor 19. The ouput from detector 43 is fed into a video amplifier 45 whose output is in turn fed into an optional line driver 47. Optical signal detector 43 and video amplifier 45 are commercially available and may, for example, be respectively a model 7708 detector and a model 12004 amplifier sold by Meret, Inc. of Santa Monica, Calif. The circuitry of receiver 41 is disclosed in FIG. 4 and its operation will be readily apparent to one skilled in the art. As any number of suitable optical signal transmitting and receiving systems may be utilized in conjunction with this invention, a detailed description of the construction and operation of transmitter 35 and receiver 41 as shown in FIGS. 3 and 4 is not believed necessary. As illustrated, the gain of video amplifier 45 is about 20. However, it will be appreciated that in certain applications of the sensor of this invention, both video amplifier 45 and line driver 47 may not be necessary and thus they are optional.

As described above, conductors or electrodes 29a, 29b are part-spherical conductive members electrically separated from one another by electrical insulative tape 31. These part-spherical electrodes are mechanically fastened together so as to form spherical sensor body 21 which totally encloses and therefore shields sensor and signal transmitting means 25 from the electric field surrounding the sensor. Due to the spherical shape of sensor body 21, it has a greater surface area than other sensor body shapes and is also able to withstand higher field potentials without corona discharge therefrom. In general, the voltage output of an electric field sensor is proportional to the sensors equivalant area. Since the equivalent area of a spherical shaped body is relatively large, spherical sensor 19 is particularly well-suited for measuring either low magnitude or high voltage electric fields (i.e., electric fields below about 5 kV/m) due to its relaively high output signal.

As indicated generally at 19' in FIG. 8, another embodiment of the electric field sensor of the present invention is illustrated. In general, this other embodiment 19' of the electric field sensor is generally similar to spherical sensor heretofore described and thus the primed reference characters indicate corresponding parts. Sensor 19' utilizes a pair of spaced, flat circular plates 29a', 29b' of conductive sheet metal (e.g., copper or the like) which constitute a pair of space conductors or electrodes. For example, these plates may be spaced apart a distance ranging between about 1/12–1/6 the diameter of the plates. Disposed between and at least partially shielded by the plates is sensor and generator means 25'. An optical signal responsive to the electric field is transmitted from sensor 21' via fiber optic lines 27' in the same manner as heretofore described in regard to sensor 19. A particular advantage of flat plate sensor 19' of this invention is that it is directional and therefore has the ability to measure fields in only one plane of orientation.

Referring now to FIG. 9, still another embodiment of the sensor of this invention is illustrated generally at 19" and it is shown to be a so-called cylindrical sensor. Again, sensor 19" is generally similar in operation and construction to sensors 19 and 19' here described and the double primed reference characters indicate parts having corresponding structure and function. Specifically, sensor 19" is shown to comprise an elongate, generally cylindrical probe 21" having a pair of spaced elongate electrodes or conductors 29a", 29b". These part-cylindrical conductors have a part-circular outer surface and a generally planar inner surface with their inner diametric surfaces being electrically separate from one another by electrical insulating tap 31". Sensor and generator means 25" is located between conductors 29a" and 29b" so as to be at least in part shielded thereby from the electric field being sensed. Sensor generator means 25" is connected to data acquisition system 9 by means of fiber optic data transmission lines 27" in the manner heretofore described so as to electrically isolate sensor 19" from the data acquisition system. The measuring capability of cylindrical sensor 19" is dependent upon the length and diameter of the sensor body. By making the length of the sensor body long in comparison with its cross section, the cylindrical sensor 19" serves as a rod-like sensor. By making its length about the same as its cross section, it will be appreciated that the spherical sensor will approximate spherical sensor 19 heretofore described. Generally, a cylindrical sensor has an inherent limitation that the maximum field to which the cylindrical sensor is exposed before it will be subjected to corona current from the tip or end of the sensor as lower for than the spherical embodiment of the sensor of this invention. Nevertheless, cylindrical sensor 21" may have a practical use in many test applications.

Referring now again to FIG. 1, as heretofore stated, test specimen 1 has a pair of line conductors 3 disposed within the test specimen in which an induced current will be generated or induced when the test specimen is exposed to a high voltage electric field. In accordance with this invention, test specimen 1 is provided with means, as indicated at 49, generally similar to sensor transmitter means 25 for receiving the induced voltages or current from the pair of spaced conductors 3 and for transmitting the optical signals via optical data transmission lines 7 to remotely located data acquisition system 9. Thus, test specimen 1 is electrically isolated from data acquisition means 9 by means of non-electrical conductive fiber optic data transmission lines 7 and thus prevents the formation of ground loops between test specimen 1 and the data acquisition system. This in turn allows more accurate transmission of data from the test specimen to the data acquisition system. Moreover, by electrically isolating the test specimen and by preventing the formation of ground loops, distortions of the electric field caused by the presence of the test specimen in the electric field are minimized and the perturbations of the the field caused by the test specimen and the data acquisition system are substantially reduced. This in turn results in a more accurate simulations or test conditions.

Referring now to FIGS. 6a–6c, a high voltage discharge sequence for a double arc discharge lightning simulation test is depicted. The measurement was made in a test set up generally as shown in FIG. 1 with the output of generator 11 at 600 kV and with floating electric field sensor 19 positioned approximately 8 feet (2.4 m.) to one side of test specimen 1 and mounted on a dielectric stand 23 approximately 3 feet (1 m.) from the floor (i.e., from the ground plane). At time $t=T_1$ (FIG. 6a), the output of high voltage generator 11 is applied to output inductor 15. Electrostatic shield 12 between the high voltage generator and test specimen 1 prevents field changes at the generator for being measured by electric field sensor 19 prior to time $T_1$. The field change as seen at the test specimen at time $T_1$ occurs over a period of approximately 230 nanoseconds. The average rate of change of the electric field (dE/dt) applied to test specimen 1 is approximately $1.1 \times 10^{12}$ volts/m per second.

During the time interval from $T_1$ to $T_2$, streamers from discharge probe 15 propagate through the virgin air and at time $T_2$ complete an arc path to test specimen 1. The test specimen is situated in this changing field, and since it is electrically floating, it is also undergoing a change in electric potential. As the test specimen changes potential, it presents less potential difference to the probe and streamers and thus partially shields the probe from ground. The time for arc closure to the test specimen requires a longer time than if the test specimen were grounded. During this period of time, a redistribution of the charge on the cylinder takes place so as to cancel out the external field at the surface of the test specimen. As the test specimen charge redistributes itself, the electric field seen by sensor 19 indicates that the approach of the streamers carrying the output voltage from the generator closer to ground. During this period of about 5.1 microseconds, the field at the test specimen increases at a rate of about $10^{10}$ volts/m per second (E-dot).

At time $T_2$ the arc contacts the cylinder (see FIG. 6b) and charges it to approximately 520 kV. The attachment of the streamers to the test specimen results in the transfer of a charge to the test specimen and the test specimen is charged from about 350 kV in about 520 kV in about 320 nanoseconds for an average rate of change of voltage of (dV/dt) of about $5.5 \times 10^{11}$ per second.

During the time interval $T_2$–$T_3$, streamers complete a path from the test specimen to ground and during this time, the test specimen voltage drops (due to generator losses) to about 510 kV. At time $T_3$, the arc completes its path to ground and discharges to near ground potential as current begins to flow in the completed circuit. This is illustrated in FIG. 6c. The voltage on the test specimen drops in about 94 nanoseconds for an average rate of change of voltage (dV/dt) of about $5.4 \times 10^{12}$ volts per second. The actual change in potential of the field is measured by electric field sensor 19' as shown in FIG. 6. Surprisingly, the data shown in FIG. 7 are the first obtained to show the sequence of arc activity and which also show details of the operation of generator 11. Prior to this, resistive or capacitive monitors or sensors altered the marx generators waveform and hence the data.

Referring now to FIG. 5, a method of this invention of conducting a test to determine the characteristics of a free electric field E' in the atmosphere (e.g., in thunderstorms or in close proximity thereto) is illustrated. In particular, the method of this invention involves flying an airplane 101 through the region of the atmosphere which is to be measured. An electric field sensor 19 of the present invention is towed behind the airplane by means of an elongate, non-electrically conductive tow line 103 (for example, of suitable nylon rope or the like) a sufficient distance (e.g., several hundred meters) so that the presence of the aircraft in the atmosphere has substantially no effect on the electric field proximate sensor 19. Sensor 19, as heretofore described, is provided with sensor and optical data transmission means 25 which in turn may be linked to a data acquisition system within aircraft 101 by means of fiber optic data transmission lines 27. In this manner, aircraft 101 can readily fly through the region of the atmosphere to be monitored and the sensor can be towed behind the aircraft a distance sufficient so that the electric field being measured is not substantially affected by the presence of the aircraft. Additionally, the sensor itself only affects minimal disturbances or perturbations in the field (as shown by the lines of force and lines of equipotential in FIG. 5) and thus an accurate profile of the electric field characteristics existing in the region being measured can be accurately and reliably determined.

In view of the above, it will be seen that other objects and features of this invention are achieved and other advantageous results are attained.

As various changes could be made in the above constructions and methods without departing from the scope of the invention, it is intended that all matter contained in the description or shown in the accompanying drawings shall be interpreted as illustrative and not in a limiting sense.

We claim:

1. Apparatus for measuring a high voltage electric field comprising a pair of electrodes in an electric field to be measured, dielectric means supporting said electrodes within said electric field substantially free of the effects of the surroundings on the electric field proximate said electrodes, said electrodes being electrically separate from one another, means connected to said electrodes for sensing the electric potential of said field, means for generating an output signal indicative of said electric field being sensed, said sensing means and said generating means being effectively shielded from the electric field by said electrodes, means for receiving said signal located remote from said generating means so as to have substantially no effect on said field adjacent said apparatus, and non-electrically conductive means for transmitting said signal from said generating means to said remote receiving means.

2. Apparatus for measuring a high voltage electric field comprising a pair of electrodes in an electric field to be measured, dielectric means supporting said electrodes within said electric field substantially free of the effects of the surroundings on the electric field proximate said electrodes, said electrodes being electrically separate from one another, means connected to said electrodes for sensing the electric potential of said field, means for generating an output signal indicative of said electric field being sensed, said sensing means and said generating means being effectively shielded from the electric field by said electrodes, means for receiving said signal located remote from said generating means so as to have substantially no effect on said field adjacent said apparatus, and non-electrically conductive means for transmitting said signal from said generating means to said remote receiving means, said non-electrically conductive transmitting means comprising fiber optic transmission lines of suitable non-electrically conductive, light transmitting material interconnecting said generating means and said remote receiving means.

3. Apparatus as set forth in claim 2 wherein said generating means includes means for transmitting an optical signal to said remote receiving means via said fiber optic transmission lines.

4. Apparatus as set forth in claim 3 wherein said generating means further is responsive to changes in said field and transforms said changes in said field into changes of light capable of being transmitted by said fiber optic transmission lines.

5. Apparatus as set forth in claim 4 wherein said means for transforming said changes of field into changes of light comprises an infrared generator having an output of infrared light transmittable through said fiber optic transmission lines.

6. Apparatus as set forth in claim 4 wherein said receiving means includes means for detecting light transmitted from said generating means via said fiber optic transmission lines.

7. Apparatus as set forth in claim 6 wherein said light detecting means generates a signal responsive to changes in said field, and wherein said receiving means includes means for amplifying said signal generated by said detecting means.

8. Apparatus for measuring a high voltage electric field comprising a pair of electrodes in an electric field to be measured, said electrodes being electrically separate from one another, dielectric means supporting said electrodes within said electric field substantially free of the effects of the surroundings on the electric field proximate said electrodes, means connected to said electrodes for sensing the electric potential of said field, and means for generating an output signal indicative of said electric field being measured, said electrodes being a pair of part-spherical members of electrically conductive material, said part-spherical members being connected together so as to form a hollow spherical sensor body and being electrically insulated from one another, said generating means being located within said spherical sensing member for being shielded thereby, means for receiving said signal located remote from said generating means so as to have substantially no effect on said field adjacent said apparatus, and non-electrically conductive means for transmitting said signal from said generating means to said remote receiving means.

9. Apparatus for measuring a high voltage electric field comprising a pair of electrodes in an electric field to be measured, said electrodes being electrically separate from one another, means connected to said electrodes for sensing the electric potential of said field, means for generating an output signal indicative of said electric field being sensed, said electrodes being a pair of flat plates of electrically conductive material arranged in generally fact-to-face relation and spaced apart a predetermined distance, said plates being electrically separate from one another, said generating means being located between said plates for being shielded at least in part thereby, dielectric means supporting said electrodes within said electric field substantially free of the effects of the surroundings on the electric field proximate said electrodes, means for receiving said signal located remote from said generating means so as to have substantially no effect on said field adjacent said apparatus, and non-electrically conductive means for transmitting said signal from said generating means to said remote receiving means.

10. Apparatus for measuring a high voltage electric field comprising a pair of electrodes in an electric field to be measured, said electrodes being electrically separate from one another, means connected to said electrodes for sensing the electric potential of said field, means for generating an output signal indicative of said electric field being sensed, said electrodes being a pair of elongate, part-cylindrical members, each of which has a part-circular cross section and a part-circular outer surface, said part-cylindrical members being spaced apart a predetermined distance, dielectric means supporting said electrodes within said electric field substantially free of the effects of the surroundings on the electric field proximate said electrodes, said generating means being located between said members and being shielded at least in part thereby, means for receiving said signal located remote from said apparatus so as to have substantially no effect on said field adjacent said apparatus, and non-electrically conductive means for transmitting said signal from said generating means to said remote receiving means.

11. A method of measuring an electric field in the atmosphere, such as may be present in a thunderstorm or the like, comprising the steps of:
flying an aircraft through the electric field to be measured;
towing an electric field sensor behind the aircraft by means of a non-electrically conductive tow line, said sensor being towed behind the aircraft a distance sufficient to substantially prevent the aircraft from unduly disturbing the electric field being measured by said sensor;
sensing the electrical field measured by said electric field sensor; and
transmitting data from said electric field sensor to a remote data acquisition system by means of a non-electrically conductive data transmission means.

12. The method of claim 11 further comprising transforming said electric field data into optical signals and transmitting said optical signals to said remote data acquisition system via fiber optic transmission means.

* * * * *